United States Patent
Oguz et al.

(10) Patent No.: US 10,950,660 B2
(45) Date of Patent: Mar. 16, 2021

(54) PERPENDICULAR STTM FREE LAYER INCLUDING PROTECTIVE CAP

(71) Applicant: Intel Corporation, Santa Clara, CA (US)

(72) Inventors: Kaan Oguz, Portland, OR (US); Kevin P. OBrien, Portland, OR (US); Brian S. Doyle, Portland, OR (US); Charles C. Kuo, Hillsboro, OR (US); Mark L. Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/328,533

(22) PCT Filed: Sep. 29, 2016

(86) PCT No.: PCT/US2016/054517
§ 371 (c)(1),
(2) Date: Feb. 26, 2019

(87) PCT Pub. No.: WO2018/063255
PCT Pub. Date: Apr. 5, 2018

(65) Prior Publication Data
US 2019/0198567 A1    Jun. 27, 2019

(51) Int. Cl.
*H01L 27/22*    (2006.01)
*H01L 43/08*    (2006.01)
*H01L 43/10*    (2006.01)
*H01L 43/12*    (2006.01)
*H01L 43/02*    (2006.01)

(52) U.S. Cl.
CPC .......... *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC ........ H01L 27/228; H01L 43/02; H01L 43/08
See application file for complete search history.

(56) References Cited

U.S. PATENT DOCUMENTS

| | | | |
|---|---|---|---|
| 9,337,415 B1* | 5/2016 | Oh | H01L 43/08 |
| 2007/0014149 A1* | 1/2007 | Nagamine | G11C 11/1659 365/158 |
| 2015/0091110 A1* | 4/2015 | Kuo | G11C 29/028 257/421 |
| 2015/0255134 A1* | 9/2015 | Uchida | G11C 11/161 257/421 |

* cited by examiner

*Primary Examiner* — Errol V Fernandes
(74) *Attorney, Agent, or Firm* — Schwabe, Williamson & Wyatt, P.C.

(57) ABSTRACT

A perpendicular spin transfer torque memory (pSTTM) device incorporates a magnetic tunnel junction (MTJ) device having a free magnetic stack and a fixed magnetic stack separated by a dielectric tunneling layer. The free magnetic stack includes an uppermost magnetic layer that is at least partially covered by a cap layer. The cap layer is at least partially covered by a protective layer containing at least one of: ruthenium (Ru); cobalt/iron/boron (CoFeB); molybdenum (Mo); cobalt (Co); tungsten (W); or platinum (Pt). The protective layer is at least partially covered by a cap metal layer which may form a portion of MTJ electrode. The protective layer minimizes the occurrence of physical and/or chemical attack of the cap layer by the materials used in the cap metal layer, beneficially improving the interface anisotropy of the MTJ free magnetic layer.

26 Claims, 6 Drawing Sheets

PERPENDICULAR STTM FREE LAYER INCLUDING PROTECTIVE CAP

CROSS-REFERENCE TO RELATED APPLICATIONS

This patent application is a U.S. National Phase Application under 35 U.S.C. § 371 of International Application No. PCT/US2016/054517, filed on Sep. 29, 2016, the entire contents of which is hereby incorporated by reference herein.

TECHNICAL FIELD

The present disclosure relates to perpendicular spin transfer torque memory (pSTTM).

BACKGROUND

Magnetoresistive random access memory (MRAM) is an evolving area of storage devices in which data is not stored as an electric charge or current flow, but instead in the form of magnetic storage elements. In MRAM elements are formed using two magnetic elements separated by a dielectric layer, a magnetic tunnel junction (MTJ). The MTJ includes a fixed (pinned) magnetic element set to a particular polarity and a free magnetic element having a switchable magnetic field that may be changed between two binary states by passage of a current through the MTJ. A memory device may be formed using a number of these individual, MTJ-based storage "cells." Spin transfer torque (STT) uses a current formed from spin-aligned or polarized electrons to develop a torque that is transferred to the free magnetic element to change the magnetic state of the free magnetic element.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1B:
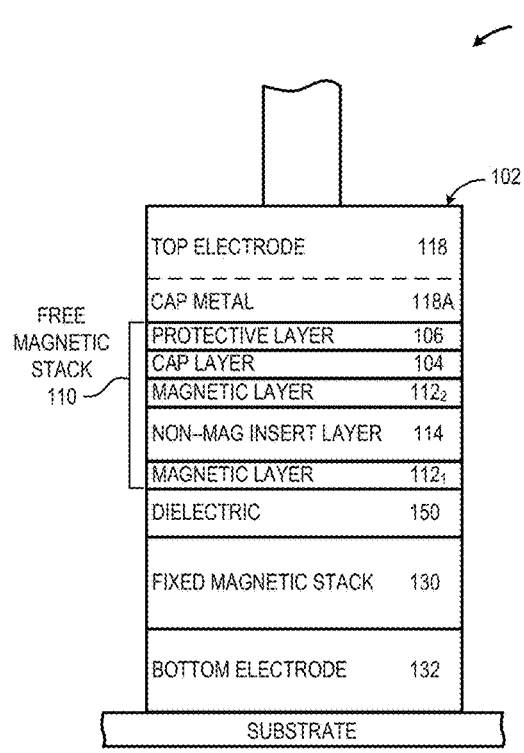
FIG. 1B provides a partial cross-sectional view of the illustrative MTJ element depicted in FIG. 1A more clearly depicting the free magnetic stack having the protective layer deposited between the cap layer and the cap metal layer, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The magnetic tunnel junction (MTJ) stack used in perpendicular spin transfer torque memory (pSTTM) uses a free magnetic stack that includes at least one magnetic layer. The free magnetic stack includes a dielectric layer disposed proximate a lowermost magnetic layer in the free magnetic stack and a cap layer disposed proximate an uppermost magnetic layer in the free magnetic stack. The cap layer enhances the performance of the interface between the uppermost free magnetic layer and the top electrode and also minimizes the likelihood of physical and/or chemical damage to the cap layer caused by the cap metal layer included in the top electrode.

The thermal stability of the free magnetic layer in a pSTTM device depends on the interface anisotropy provided by the dielectric layer and the cap layer included in the free magnetic stack. In some instances, both dielectric layer and the cap layer may include magnesium oxide (MgO). A cap metal layer forming a portion of the MTJ device top electrode may be deposited, patterned, or otherwise formed on, about, or across the cap layer. However, various materials, such as tantalum, that may be used in the cap metal layer, have been found to degrade the cap layer through intermixing with the cap layer and also by reducing the oxygen in cap layers formed using metal oxides, such as magnesium oxide. The systems and methods disclosed herein beneficially reduce the damage to the cap layer caused by the cap metal layer through the use of a protective layer deposited between the cap layer and the cap metal layer. This protective layer reduces intermixing between the cap layer and the cap metal layer and decreases the tendency for the materials used in forming the cap metal layer to physically damage and/or chemically attack the cap layer.

A MTJ free magnetic stack is disclosed herein. The MTJ free magnetic stack may include a cap layer; a plurality of magnetic layers having a first magnetic layer disposed proximate the cap layer; a cap metal layer; and a protective insert layer disposed between the cap layer and the cap metal layer, and proximate both the cap layer and the cap metal layer.

A pSTTM device is also disclosed herein. The pSTTM device may include an MTJ storage device. The pSTTM device may include a solid-state switching device, that includes: a source coupled to a source line; a gate coupled to a word line; and a drain. The MTJ storage device may include: a first electrode coupled to the solid-state switching device drain; a second electrode coupled to a bit line; a fixed magnetic layer stack coupled to the first electrode; a dielectric layer coupled to the fixed magnetic layer stack, opposite the first electrode; and a free magnetic stack coupled to the second electrode, the free magnetic stack including: a cap layer that may include magnesium oxide; a plurality of magnetic layers having a first magnetic layer disposed proximate the cap layer; a cap metal layer; and a protective insert layer disposed between the cap layer and the cap metal layer, and proximate both the cap layer and the cap metal layer.

A pSTTM data storage method is also disclosed herein. The method may include selectively passing a write current through an MTJ device having a free magnetic stack which stores digital data by altering the magnetic orientation of the free magnetic stack. The MTJ free magnetic stack may include: a cap layer that may include magnesium oxide; a plurality of magnetic layers having a first magnetic layer disposed proximate the cap layer; a cap metal layer; and a protective insert layer disposed between the cap layer and the cap metal layer, and proximate both the cap layer and the cap metal layer.

An MTJ free magnetic stack manufacturing system is disclosed herein. The MTJ free magnetic stack manufacturing system may include a means for depositing a cap layer across at least a portion of a first magnetic layer included in a plurality of magnetic layers; a means for depositing a protective insert layer across at least a portion of the cap layer; and a means for depositing a cap metal layer across at least a portion of the protective layer.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1A:
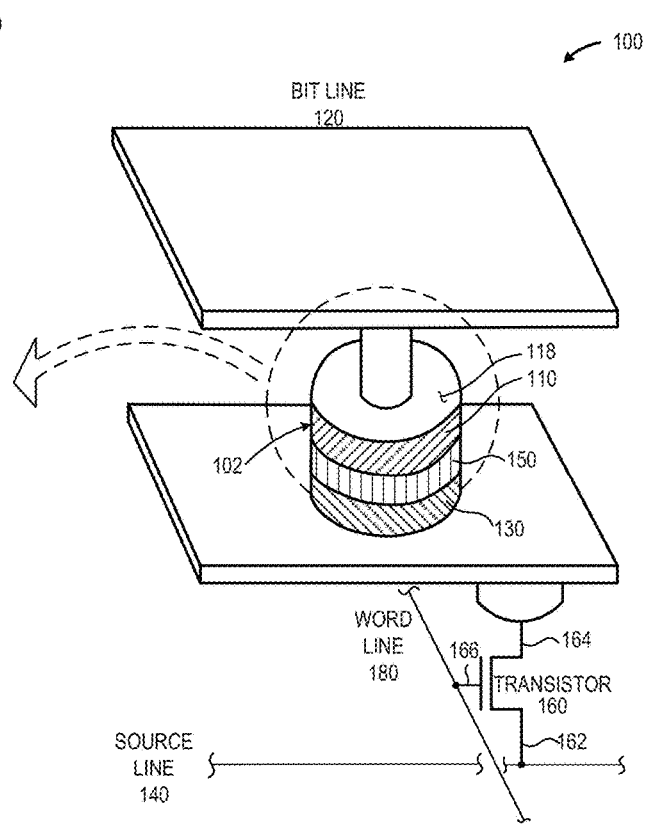
FIG. 1A provides a perspective view of an illustrative perpendicular spin transfer torque memory (pSTTM) cell incorporating a magnetic tunnel junction (MTJ) element having a free magnetic stack that includes at least one protective layer deposited between a cap layer and a cap metal layer, in accordance with at least one embodiment described herein.

FIG. 1A provides a perspective view of an illustrative perpendicular spin transfer torque memory (pSTTM) cell 100 incorporating a magnetic tunnel junction (MTJ) element 102 having a free magnetic stack 110 that includes at least one protective layer deposited between a cap layer and a cap metal layer 118A that forms all or a portion of an electrode 118 in the pSTTM cell 100, in accordance with at least one embodiment described herein. FIG. 1B provides a partial cross-sectional view of the illustrative MTJ element 102 depicted in FIG. 1A more clearly depicting the free magnetic stack 110 that includes the protective layer 106 deposited between the cap layer 104 and the cap metal layer 118A, in accordance with at least one embodiment described herein.

As depicted in FIG. 1A, the MTJ device 102 includes a free magnetic stack 110 and a fixed magnetic layer 130 separated by a barrier, tunneling, or dielectric layer 150. The free magnetic stack 110 of the MTJ device 102 conductively couples to a bit line 120. The fixed magnetic layer 130 of the MTJ device 102 conductively couples to a drain 164 of a solid state switching device, such as a transistor 160. The source 162 of the transistor 160 conductively couples to a source line 140. The gate 166 of the transistor 160 conductively couples to a word line 180. Thus, the word line 180 controls the operation of the transistor 160 and the potential difference between the bit line 120 and the source line 140 determines the direction current flows through the MTJ device 102.

As depicted in FIG. 1B, the free layer 110 includes at least one non-magnetic insert layer 114 interleaved between at least two magnetic layers 112 such that the layers included the free magnetic stack 110 includes a bottom magnetic layer $112_1$ and a top magnetic layer $112_2$ with a non-magnetic insert layer $114_1$ disposed therebetween. A cap layer 104 that includes one or more metal oxides is disposed on the uppermost magnetic layer 112 and the protective layer 106 is disposed between the cap layer 104 and the cap metal layer 118A. The protective layer 106 isolates the cap layer 104 from the cap metal layer 118A thereby beneficially limiting the degradation of the cap layer 104 caused by the cap metal layer 118A. Such degradation may include physical degradation caused by diffusion of the cap metal layer 118A into the cap layer 104 and also chemical degradation caused by the cap metal layer 118A scavenging oxygen from the cap layer 104.

The magnetic layers 112 may include any number and/or combination of magnetic materials capable of selectively producing an UP or a DOWN magnetic field responsive to the passage of a write current through the MTJ device 102. Each of the magnetic layers 112 may be deposited, patterned, or otherwise formed using any currently available or future developed deposition technology and/or techniques, such as physical vapor deposition (PVD), photolithography, electroplating, electro-less plating, sputtering, or similar. In some implementations, some or all of the magnetic layers 112 include a magnetic material containing cobalt (Co), iron (Fe), and boron (B). In some specific implementations, some or all of the magnetic layers 112 may include a magnetic material such as $Co_{20}Fe_{60}B_{20}$. Each of the magnetic layers 112 included in the free magnetic stack 110 may have the same or a different thickness. Each of the magnetic layers 112 included in the free magnetic stack 110 may have a thickness of: about 0.2 nanometers (nm) to about 1.7 nm; about 0.2 nm to about 1.5 nm; about 0.2 nm to about 1.2 nm; or about 0.2 nm to about 1 nm. The sum of the thicknesses of the individual magnetic layers $112_1$-$112_{n+1}$ may be: about 1 nanometer (nm) to about 7 nm; about 2 nm to about 7 nm; about 3 nm to about 7 nm; about 4 nm to about 7 nm; or about 5 nm to about 7 nm.

The non-magnetic insert layer 114 may be deposited, patterned, or otherwise formed using any currently available or future developed deposition technology and/or techniques, such as physical vapor deposition (PVD), photolithography, electroplating, electro-less plating, sputtering, or similar. In some implementations, the non-magnetic insert layer 114 include one or more non-magnetic materials such as tantalum (Ta), molybdenum (Mo), hafnium (Hf), tungsten (W), and iridium (Ir). In some implementations, the non-magnetic insert layer 114 include one or more binary alloys formed using two of tantalum, molybdenum, hafnium (Hf), tungsten (W), and iridium (Ir). In some implementations, the non-magnetic insert layers 114 may include one or more binary alloys formed using any two of tantalum, molybdenum, hafnium (Hf), tungsten (W), and iridium (Ir), and may be formed of an alloy having a molecular ratio of about 1:1 to about 1:3.

The non-magnetic insert layer 114 included in the free magnetic stack 110 may have a thickness of: about 0.05 nanometers (nm) to about 3 nm; about 0.1 nm to about 3 nm; or about 1.5 nm to about 3 nm. In implementations, the ratio of the thickness of a respective magnetic layer 112 to a respective non-magnetic insert layer 114 may be as low as 1:1 and may be as great as 8:1. The construction of the free magnetic stack 110 is beneficially compatible of standard complementary metal oxide semiconductor manufacturing techniques and is able to with stand temperatures of up to 400° C.

The cap layer 104 may be deposited, patterned, or otherwise formed using any currently available or future developed deposition technology and/or techniques, such as physical vapor deposition (PVD), photolithography, electroplating, electro-less plating, sputtering, or similar. The cap layer 104 may be formed using one or more oxides, such as oxides of: magnesium (MgO), aluminum (AlO$_x$), tantalum (TaO$_x$), gadolinium (GdO$_x$), hafnium (HfO$_x$), titanium (TiO$_x$), and/or tungsten (WO$_x$). In at least one implementation, the cap layer 104 may include magnesium oxide (MgO). In some implementations, the cap layer 104 may have a thickness of about: 2 nanometers (nm) or less; about 1.5 nm or less; about 1 nm or less; or about 0.5 nm or less. In some implementations, the cap layer 104 may include only magnesium oxide. In other implementations, the cap layer 104 may include one or more other metal oxides, materials, elements, or compounds.

The protective layer 106 is deposited, patterned, or otherwise formed on or across all or a portion of the cap layer 104 in the free magnetic stack 110. The protective layer 106 may be deposited, patterned, or otherwise formed using any currently available or future developed deposition technology and/or techniques, such as physical vapor deposition (PVD), photolithography, electroplating, electro-less plating, sputtering, or similar. The protective layer 106 may include one or more materials, elements, or compounds capable of protecting the cap layer 104 from damage caused by the cap metal layer 118A deposited on or across all or a portion of the protective layer 106. The protective layer 106 includes one or more of the following elements or one or more compounds containing one of the following elements: ruthenium (Ru); cobalt (Co); iron (Fe); boron (B); molybdenum (Mo); and platinum (Pt). In at least one implementation, the protective layer 106 may include one or more magnetic alloys such as CoFeB, such as $Co_{20}Fe_{60}B_{20}$. In some implementations, the protective layer 106 may have a thickness of about: 2 nanometers (nm) or less; about 1.5 nm or less; about 1 nm or less; or about 0.5 nm or less.

In embodiments, a top electrode 118 may include a cap metal layer 118A disposed at least partially across the surface of the cap layer 104. In at least one implementation, the cap metal layer 118A may include tantalum (Ta) or one or more compounds containing tantalum. In some implementations, the top electrode 118 may include one or more materials disposed in any number or combination of additional layers above the cap metal layer 118A. Example, non-limiting, materials used to form all or a portion of the top electrode include: tantalum, ruthenium, platinum, titanium nitride, tantalum nitride, tungsten, molybdenum, and alloys containing these materials.

The dielectric layer 150 is deposited, patterned, or otherwise formed between the lowermost magnetic layer 112 in the free magnetic stack 110 and the uppermost layer forming the fixed magnetic stack 130. The dielectric layer 150 may be deposited, patterned, or otherwise formed across all or a portion of the uppermost layer of the fixed magnetic stack 130 using any currently available or future developed deposition technology and/or techniques, such as physical vapor deposition (PVD), photolithography, electroplating, electroless plating, sputtering, or similar. In some implementations, the dielectric layer 150 may have a thickness of about: 2 nanometers (nm) or less; about 1.5 nm or less; about 1 nm or less; or about 0.5 nm or less. In some implementations, the dielectric layer 150 may include only magnesium oxide (MgO). In other implementations, the dielectric layer 150 may include any number and/or combination of additional or alternative materials, elements, or compounds.

The dielectric layer 150 may be deposited, patterned, or otherwise formed on, about, or across at least a portion of the fixed magnetic stack 130 using any currently available or future developed deposition technology and/or techniques, such as physical vapor deposition (PVD), photolithography, electroplating, electro-less plating, sputtering, or similar. The dielectric layer 150 may be formed using one or more oxides, such as oxides of: magnesium (MgO), aluminum (AlO$_x$), tantalum (TaO$_x$), gadolinium (GdO$_x$), hafnium (HfO$_x$), titanium (TiO$_x$), and/or tungsten (WO$_x$). In at least one implementation, the dielectric layer 150 may include magnesium oxide (MgO).

The cap metal layer 118A forms at least a portion of the top electrode 118. The cap metal layer 118A is deposited, patterned, or otherwise formed on or across all or a portion of the protective layer 106 in the free magnetic stack 110. The cap metal layer 118A may be deposited, patterned, or otherwise formed using any currently available or future developed deposition technology and/or techniques, such as physical vapor deposition (PVD), photolithography, electroplating, electro-less plating, sputtering, or similar. In some implementations, the cap metal layer 118A may have a thickness of about: 7 nanometers (nm) or less; about 5 nm or less; about 4 nm or less; or about 2.5 nm or less.

In embodiments, a top electrode 118 is disposed proximate at least a portion of the protective layer 106 included in the free magnetic stack 110. In some implementations, the top electrode 118 may include any number and/or combination of full and/or partial layers 118B-118n (collectively, "top electrode layers 118") in addition to the cap metal layer 118A. For example, the MTJ device 102 depicted in FIG. 1B includes the cap metal layer 118A and the top electrode 118 may additionally include a ruthenium layer 118B overlaying at least a portion of the cap metal layer 118A. Example, non-limiting, materials useful for forming one or more layers in the top electrode 118 include: tantalum, ruthenium, platinum, titanium nitride, tantalum nitride, tungsten, molybdenum, and alloys containing these materials.

In embodiments, a bottom electrode 132 is disposed proximate the fixed magnetic layer 130. In some implementations, the bottom electrode 130 may include one or more conductive layers. For example, the MTJ device 102 depicted in FIG. 1B may include a platinum (Pt) layer disposed proximate all or a portion of the lowermost layer of the fixed magnetic stack and a tantalum (Ta) layer disposed proximate all or a portion of the Pt layer.

In operation, the passage of a write current through the pSTTM device 100 sets the memory state of the device to a binary value of "0" or "1" based on the direction of the magnetic field within the free magnetic layer. Damping is a measure of the "difficulty" of transitioning the magnetic field in the free magnetic stack 110 and consequently a measure of the write current required for the pSTTM device 100 to operate as a binary data storage device (greater damping=greater write current; conversely, reduced damping=reduced write current). Interfacial anisotropy within the free magnetic stack 110 provides a measure of the stability or data retention time of the pSTTM device 100. The stability of the pSTTM device 100 improves with increasing interfacial anisotropy and decreases with decreasing interfacial anisotropy. The systems and methods described herein beneficially decreases the damping of the free magnetic stack 110 and increases the interfacial anisotropy within the pSTTM device 100, thereby reducing the needed write current and increasing the data stability within the pSTTM device 100.

The resistance of the pSTTM device 100 changes based on the orientation of the magnetic state of the free magnetic stack 110. Thus, the binary data stored in the pSTTM device 100 may be read by passing a read current through the device and measuring the resistance of the pSTTM device 100.

The fixed magnetic stack 130 may include any number and/or combination of currently available and/or future developed layers capable of providing a fixed magnetic field for the MTJ device 102. Example fixed magnetic stacks 130 may include, but are not limited to, one or more layers containing a magnetic material, such as CoFeB; one or more layers containing cobalt (Co) or an alloy containing cobalt; one or more layers containing platinum (Pt) or an alloy containing platinum; one or more layers containing ruthenium (Ru) or an alloy containing ruthenium; or combinations thereof.

Figure 2:
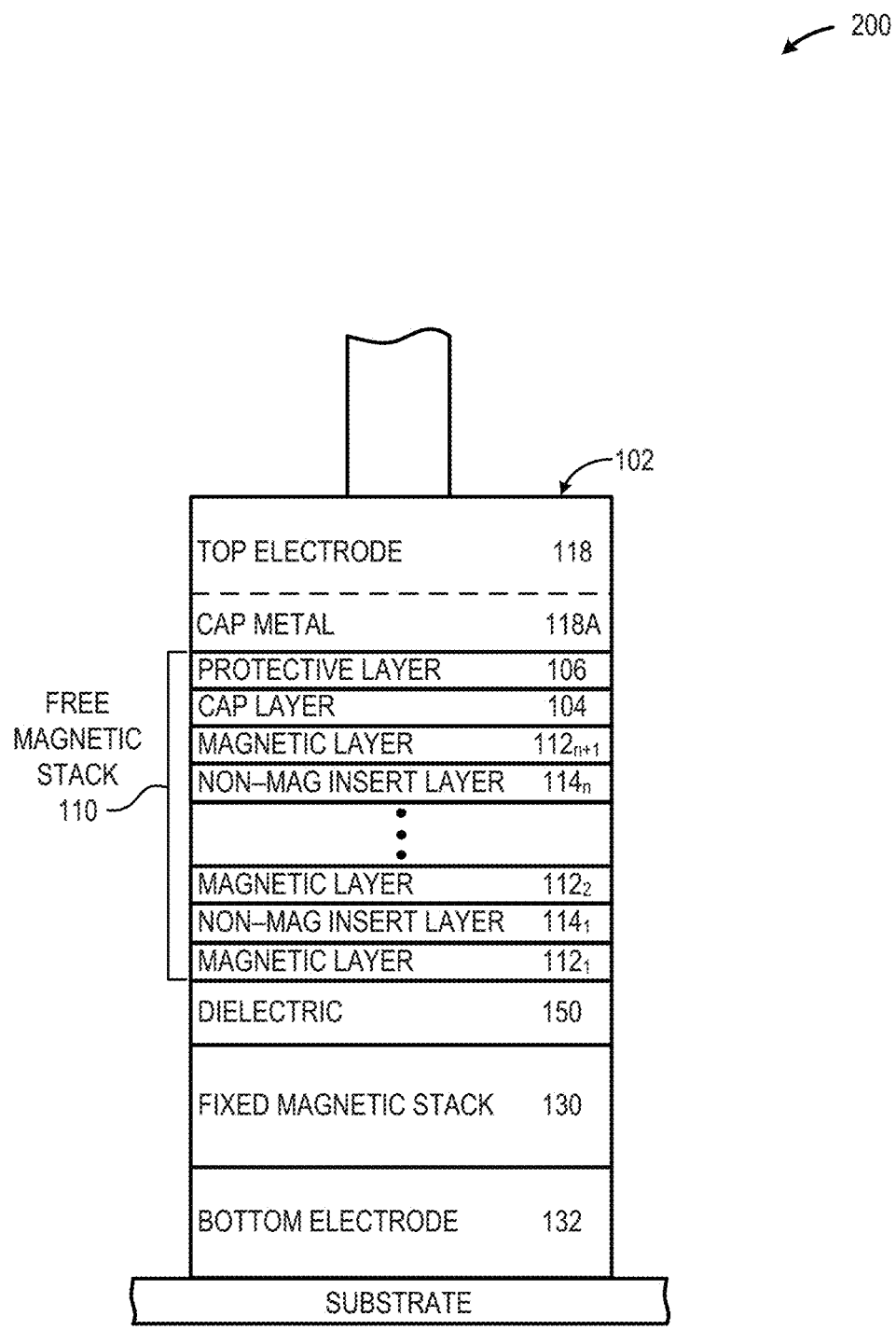
FIG. 2 depicts an alternative free magnetic layer construction that includes a plurality of magnetic layers interleaved with a plurality of non-magnetic insert layers and which also includes a protective layer disposed between the cap layer and the cap metal layer, in accordance with at least one embodiment described herein.

FIG. 2 depicts an alternative free magnetic layer 110 construction that includes a plurality of magnetic layers 112 interleaved with a plurality of non-magnetic insert layers 114 and which also includes a protective layer 106 disposed between the cap layer 104 and the cap metal layer 118A, in accordance with at least one embodiment described herein. In general, where a plurality of "n" (where n is whole number greater than or equal to 2) non-magnetic insert layers 114 are used, "n+1" magnetic layers 112 are interleaved to provide at least a portion of the free magnetic stack 110. Such an arrangement provides a magnetic layer $112_1$ as the lowermost layer and a magnetic layer $112_{n+1}$ as the uppermost layer, with the non-magnetic insert layers 114 interleaved with magnetic layers $112_2$-$112_n$ therebetween. As in FIG. 1B, the cap layer 104 is formed, patterned, or otherwise deposited across all or a portion of the uppermost magnetic layer 112. The protective layer 106 is then formed, patterned, or otherwise deposited across all or a portion of the cap layer 104.

Interleaving the magnetic layers 112 with the non-magnetic insert layers 114 has been found to advantageously improve interface anisotropy, thereby improving the stability of the pSTTM device 100. Interleaving the magnetic layers 112 with the non-magnetic insert layers 114 has also been found to reduce damping of the free magnetic stack 110 thereby beneficially decreasing the required write current to the pSTTM device 100. Each of the plurality of non-magnetic insert layers 114 may include the same or a different number and/or combination of materials. In embodiments, some or all of the materials included in each of the non-magnetic insert layers 114 may include one or more non-magnetic materials.

Each of the plurality of non-magnetic insert layers 114 included in the free magnetic stack 110 may have the same or a different thickness. Each of the non-magnetic insert layers 114 included in the free magnetic stack 110 may have a thickness of: about 0.05 nanometers (nm) to about 3 nm; about 0.1 nm to about 3 nm; or about 1.5 nm to about 3 nm. The sum of the thicknesses of the individual non-magnetic insert layers $114_1$-$114_n$ may be: about 0.1 nanometer (nm) to about 6 nm; about 0.15 nm to about 6 nm; about 2 nm to about 6 nm; about 2.5 nm to about 6 nm; or about 3 nm to about 6 nm. In implementations, the ratio of the thickness of a respective magnetic layer 112 to a respective non-magnetic insert layer 114 may be as low as 1:1 and may be as great as 8:1. The construction of the free magnetic stack 110 is beneficially compatible of standard complementary mixed oxide manufacturing techniques and is able to with stand temperatures of up to 400° C.

In the embodiment depicted in FIG. 2, the dielectric layer 150 has a thickness of less about 1 nanometer (nm) and is formed, patterned, or otherwise disposed between the uppermost layer of the fixed magnetic stack 130 and the lowermost magnetic layer $112_1$ of the free magnetic stack. In other embodiments, the dielectric layer 150 may have a thickness of: about 0.5 nanometers (nm) or less; about 1 nm or less; about 1.5 nm or less; or about 2 nm or less.

Figure 3:
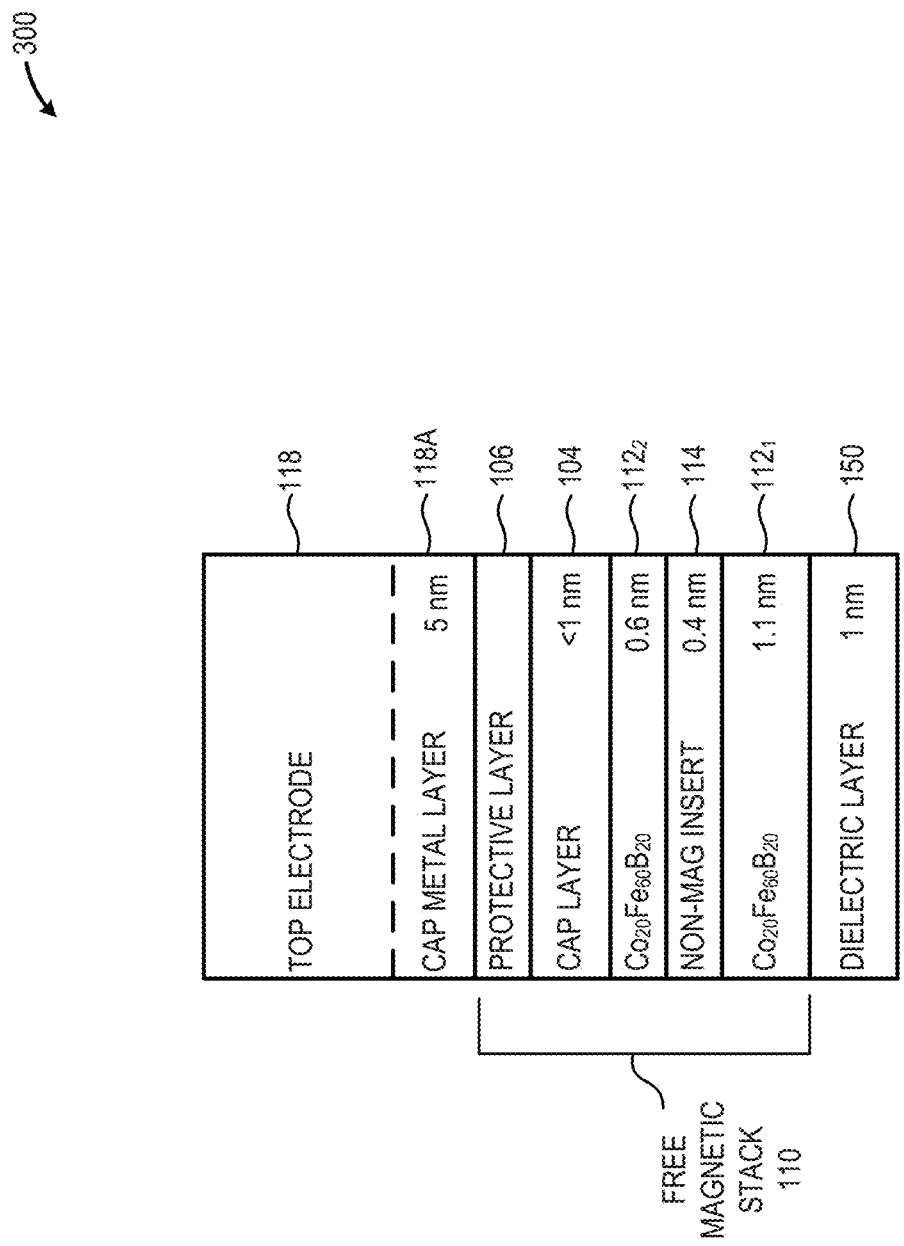
FIG. 3 provides a cross-sectional view of an illustrative free magnetic stack that includes two (2) magnetic layers and a single non-magnetic insert layer, in accordance with at least one embodiment described herein.

FIG. 3 provides a cross-sectional view of an illustrative free magnetic stack 110 that includes two (2) magnetic layers $112_1$-$112_2$ and a single non-magnetic insert layer 114, in accordance with at least one embodiment described herein. The example free magnetic stack 110 depicted in FIG. 3 includes a cap layer 104 that includes magnesium oxide (MgO) having a thickness of less than about 1 nanometer (nm) and disposed proximate the uppermost magnetic layer $112_2$. The free magnetic stack 110 also includes a protective layer 106 disposed on, about, or across all or a portion of the cap layer 104. The protective layer protects the cap layer 104 from physical and/or chemical damage caused by the cap metal layer 118A.

In the illustrative embodiment depicted in FIG. 3, the free magnetic stack 110 includes a dielectric layer 150 disposed proximate the lowermost magnetic layer $112_1$ and has a thickness of approximately 1 nanometer (nm). As depicted in FIG. 3, in some implementations, the free magnetic stack 110 includes magnetic layers 112 formed using CoFeB. In embodiments, one or more magnetic materials, such as CoFeNiB or NiFeB, may be used as an alternative or in addition to CoFeB. A first magnetic layer $112_1$ that includes $Co_{20}Fe_{60}B_{20}$ having a thickness of about 1.1 nanometers (nm) is deposited, patterned, or otherwise formed on, about, or across at least a portion of the dielectric layer 150. A non-magnetic insert layer 114 having a thickness of about 0.4 nm is deposited, patterned, or otherwise formed on, about, or across at least a portion of the first magnetic layer $112_1$. A second magnetic layer $112_2$ that includes $Co_{20}Fe_{60}B_{20}$ having a thickness of about 0.6 nm is deposited, patterned, or otherwise formed on, about, or across at least a portion of the non-magnetic interface layer 114.

A cap layer 104 is deposited, patterned, or otherwise formed on, about, or across at least a portion of the second magnetic layer $112_2$. As depicted in FIG. 3, the cap layer 104 has a thickness of less than about 1 nm. A protective layer 106 is deposited, patterned, or otherwise formed on, about, or across at least a portion of the cap layer 104. In the embodiment illustrated in FIG. 3, the protective layer 106 has a thickness of about 1 nm. A cap metal layer 118A is deposited, patterned, or otherwise formed on, about, or across at least a portion of the protective layer 106. In the embodiment depicted in FIG. 3, the cap metal layer 118A has a thickness of about 5 nm.

As depicted in FIG. 3, the top electrode 118 includes the cap metal layer 118A and an additional layer. In embodiments, the cap metal layer 118A may include tantalum (Ta), iridium (Ir), platinum (Pt), tungsten (W), and/or alloys containing tantalum, iridium, platinum, and/or tungsten. The top electrode 118 may include additional layers formed, patterned, or otherwise deposited on, about, or across, all or a portion of the surface of cap metal layer 106.

Figure 4:
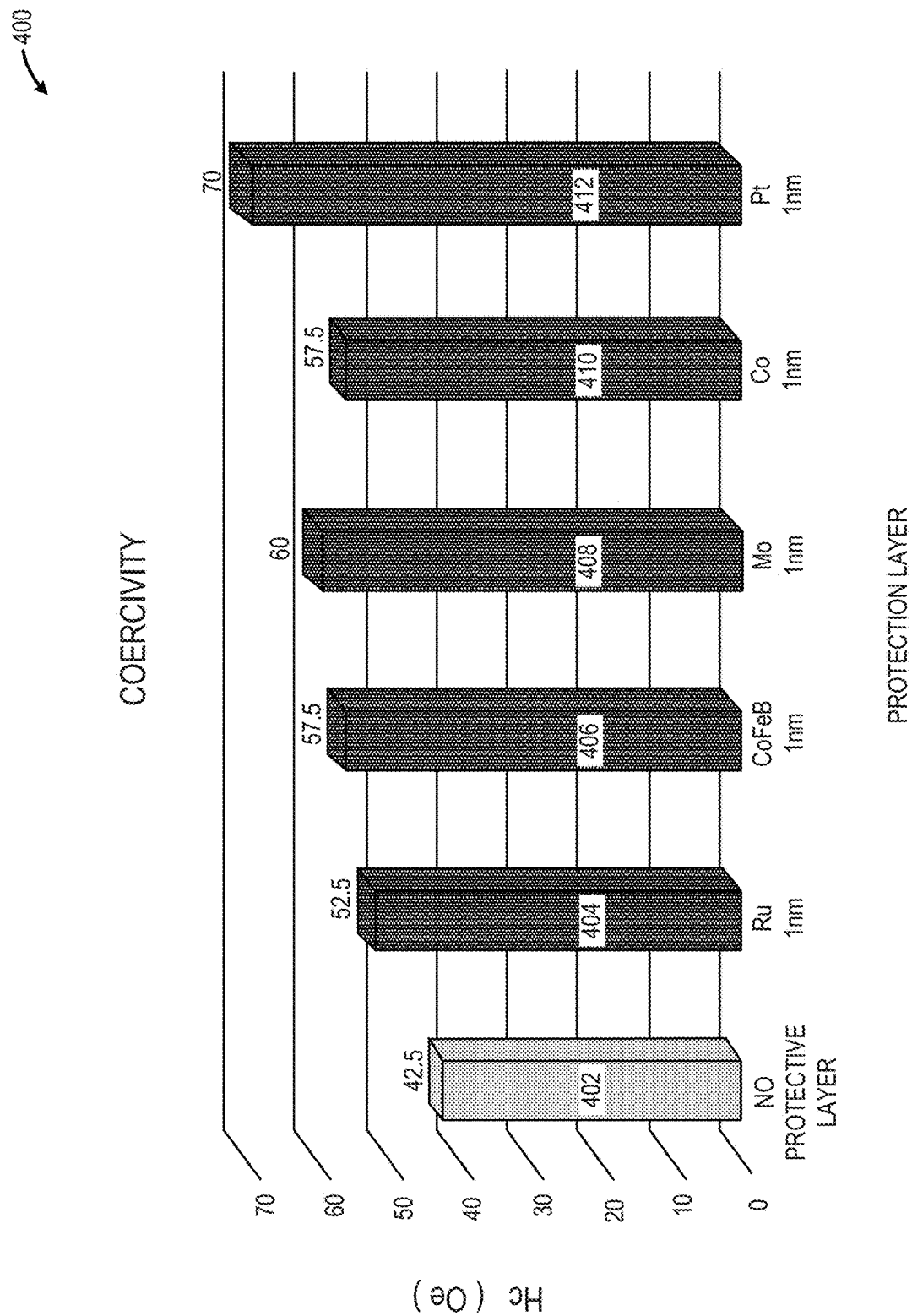
FIG. 4 provides a chart comparing the coercivity in oersted (Hc) for five (5) different example protective layer materials included in a free magnetic stack compared to a free magnetic stack that does not include a protective layer, in accordance with at least one embodiment described herein.

FIG. 4 provides a chart 400 comparing the coercivity in oersted ($H_c$) for five (5) different example protective layer materials 404-412 included in a free magnetic stack 110 compared to the coercivity of a free magnetic stack 110 that does not include a protective layer 402, in accordance with at least one embodiment described herein. Interface anisotropy is a measure of the stability of the pSTTM device 100. Coercivity is a measure of the resistance of a magnetic material to changes in magnetization. In the illustrated context, coercivity is a blanket measurement indicative of the strength of the interface anisotropy of the free magnetic layer 110. Increasing interface anisotropy beneficially results in increased stability for the pSTTM device 100. Conversely, decreasing interface anisotropy detrimentally results in decreased stability for the pSTTM device 100.

As depicted in FIG. 4, the value of the coercivity of an illustrative free magnetic stack 110 without a protective layer 106 is about 42.5 oersted. The coercivity of an illustrative free magnetic stack 110 that includes a 1 nanometer thick ruthenium protective layer is about 52.5, about a 23% improvement over the free magnetic stack without a protective layer 106. The coercivity of an illustrative free magnetic stack 110 that includes a 1 nanometer thick CoFeB protective layer is about 57.5, about a 35% improvement over the free magnetic stack without a protective layer 106. The coercivity of an illustrative free magnetic stack 110 that includes a 1 nanometer thick molybdenum protective layer is about 60, about a 41% improvement over the free magnetic stack without a protective layer 106. The coercivity of an illustrative free magnetic stack 110 that includes a 1 nanometer thick cobalt protective layer is about 57.5, about a 35% improvement over the free magnetic stack without a protective layer 106. The coercivity of an illustrative free magnetic stack 110 that includes a 1 nanometer thick platinum protective layer is about 70, a 65% improvement over the free magnetic stack without a protective layer 106.

The inclusion of a protective layer 106 between the cap layer 104 and the cap metal layer 118A beneficially improves the coercivity of the free magnetic layer by 23% to 65%. In practical terms, the inclusion of a protective layer 106 improves the interface anisotropy of the free magnetic layer 110, improving the stability of memory devices using such MTJ devices 102 in pSTTM memory applications.

Figure 5:
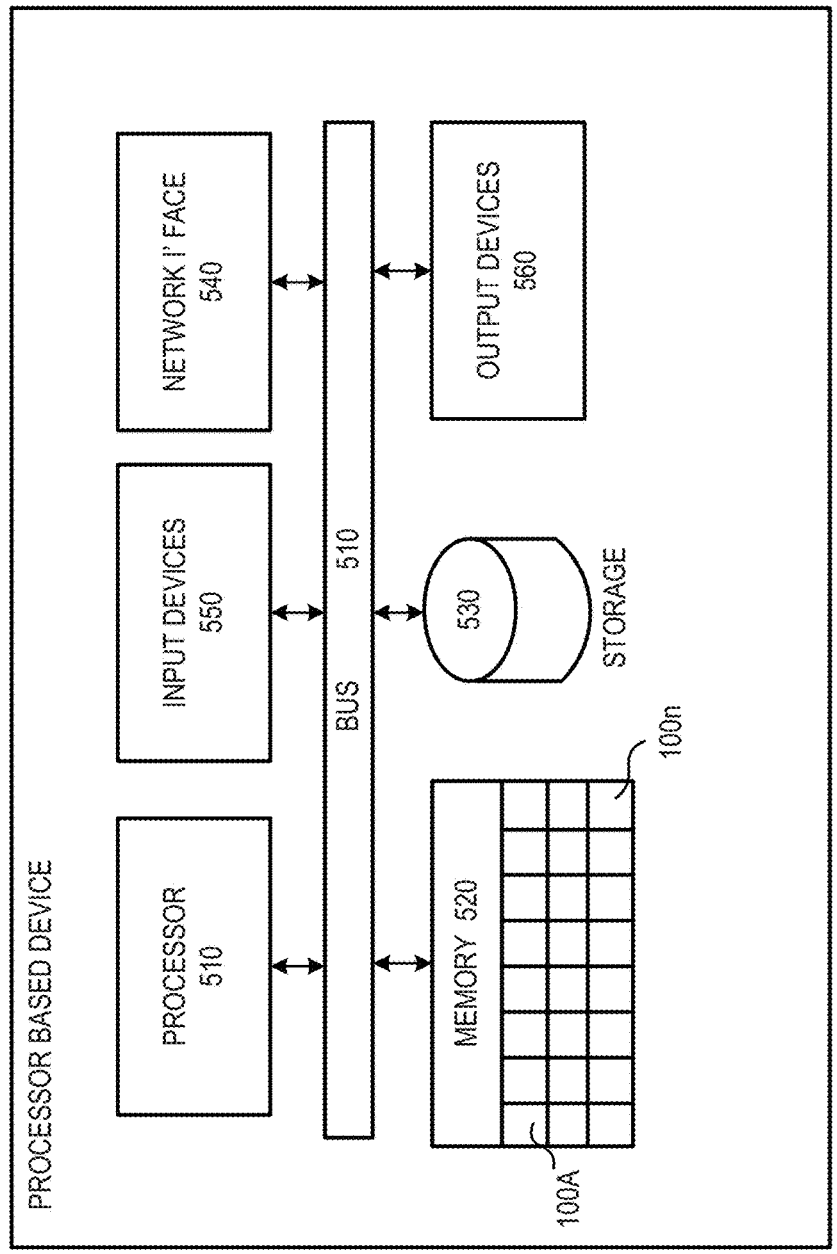
FIG. 5 provides a block diagram of an illustrative processor-based device that includes a memory formed by a number of pSTTM devices, in accordance with at least one embodiment described herein.

FIG. 5 provides a block diagram of an illustrative processor-based device 500 that includes a memory 520 formed by a number of pSTTM devices 100A-100n (collectively, "pSTTM devices 100"), in accordance with at least one embodiment described herein. The processor-based device 500 may include any currently available and/or future developed device or system that includes a memory such as a random access memory (RAM) capable of using pSTTM devices 100 to provide at least a portion of the RAM. Illustrative, non-limiting examples of such devices may include: desktop computers, servers, Internet-of-Things devices, laptop computers, wearable computers, handheld computers, smartphones, personal digital assistants, vehicle controllers, equipment controllers, workstations, and the like.

The processor-based device 500 includes a processor 510, memory 520, non-transitory data storage 530, one or more wired or wireless network interfaces 540, one or more wired or wireless input devices 550, and/or one or more wired or wireless output devices 560. The processor 510 may include various hardwired, configurable, and/or reconfigurable circuits or circuitry. Such circuitry may be implemented in the form of hardwired circuits, programmable circuits, controllers, signal processors, processors, microprocessors, programmable gate arrays, or combinations thereof.

The processor 510 in each of the peer devices 110 may include a variety of electronic and/or semiconductor components that are disposed partially or wholly in a wearable computer, portable computing device, personal digital assistant, personal computer, or other similar currently available or future developed processor-based device and/or system capable of executing machine-readable instructions. The processor 510 is operably and/or communicably coupled to various components within the processor-based device 500 via one or more buses 670. As depicted in FIG. 5, the bus 570 communicably couples various system components, such the memory 520 containing the pSTTM devices 100, to the processor 510. The bus 570 interconnecting at least some of the components in the processor-based device 500 may employ any currently available and/or future developed serial or parallel bus structures or architectures.

Figure 6:
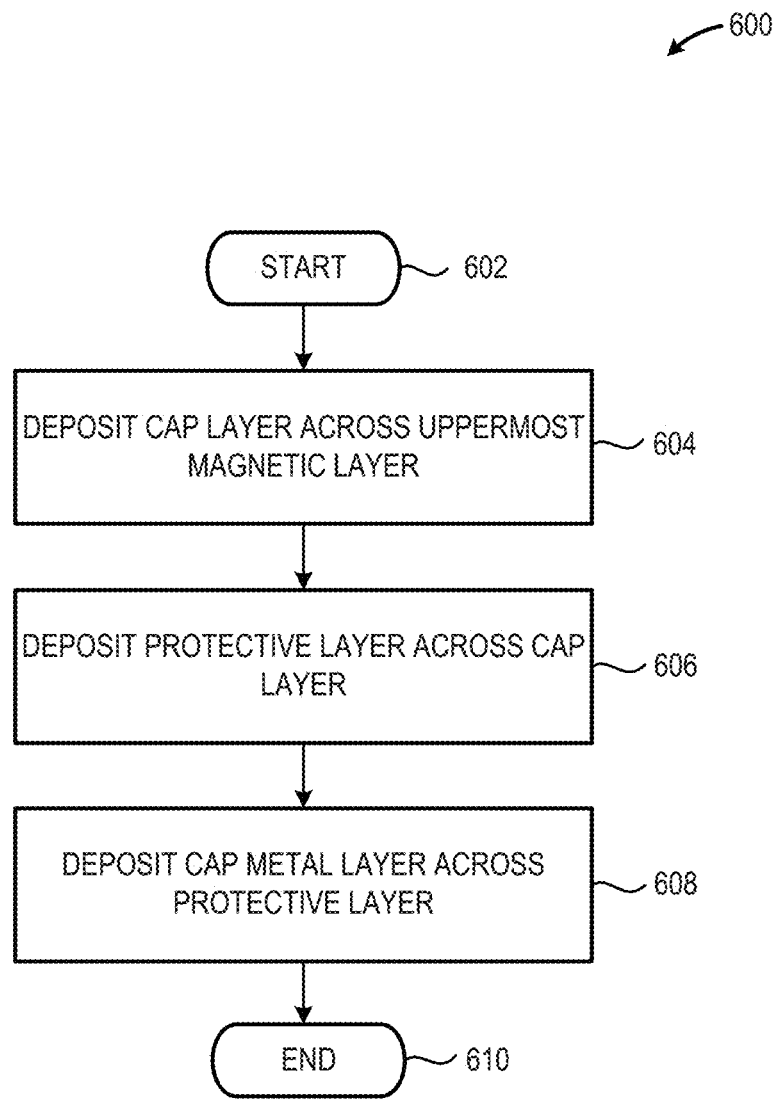
FIG. 6 provides a high-level logic flow diagram of an illustrative MTJ free magnetic stack manufacturing method in which the free magnetic stack includes a protective layer disposed between a cap layer and a cap metal layer, in accordance with at least one embodiment described herein.

The processor 510 may include, but is not limited to any current or future developed single- or multi-core processor or microprocessor, such as: one or more systems on a chip (SOCs); one or more central processing units (CPUs); one or more digital signal processors (DSPs); one or more graphics processing units (GPUs); one or more application-specific integrated circuits (ASICs), one or more field programmable gate arrays (FPGAs), and the like. Unless described otherwise, the construction and operation of the various blocks illustrated in FIG. 6 are of conventional design. As a result, such blocks need not be described in further detail herein, as they are readily understood by those skilled in the relevant art.

The memory 520 includes random access memory, at least a portion of which includes pSTTM devices 100A-100n. A non-volatile portion of the memory 520 includes a basic input/output system ("BIOS"). The BIOS provides basic functionality for the processor-based device 500, for example by causing the processor 510 to load one or more machine-readable instruction sets that cause the processor-based device 500 to perform one or more functions.

The processor-based device 500 includes a communicably coupled, non-transitory, data storage device 530. The non-transitory, data storage device 530 may include any number and/or combination of any currently available and/or future developed non-transitory storage devices. Non-limiting examples of such non-transitory, data storage devices 530 may include, without limitation, one or more magnetic storage devices, one or more optical storage devices, one or more solid-state electromagnetic storage devices, one or more electroresistive storage devices, one or more molecular storage devices, one or more quantum storage devices, or various combinations thereof.

The processor-based device 500 also includes one or more network interfaces 540 that are able to communicably couple the processor-based device 500 to one or more external devices. Such network interfaces 540 may include one or more wired and/or wireless interfaces suitable for unidirectional or bidirectional communication with one or more external devices. In one example, one or more network interfaces 540 may enable the processor-based device 500 to retrieve data and/or information from one or more remote sources, such as one or more remote server based storage devices or "cloud" storage devices.

The processor-based device 500 includes one or more communicably coupled input devices 650 that permit a user of the processor-based device 500 to provide information and/or data to the processor-based device 500. Such input devices 550 may include, without limitation, one or more text entry devices (e.g., keyboard), one or more pointing devices (e.g., mouse, trackball, touchscreen), and/or one or more audio input devices. Such input devices 550 may be used, for example, to provide, enter, or otherwise supply commands (e.g., acknowledgements, selections, confirmations, and similar) as well as information (e.g., acknowledgements, corrected subject identifiers, and similar) processor 510.

The processor-based device 500 includes one or more communicably coupled output devices 560 that provide a user of the processor-based device 500 with information and/or data in the form of visible, audible, or tactile feedback. Such output devices 560 may include, without limitation, one or more visual output devices (e.g., a display device, LED display, LCD display, CRT display), one or more tactile output devices (e.g., haptic feedback or similar), one or more audio output devices, or any combination thereof.

For convenience, the processor 510, memory 520, non-volatile data storage 530, network interface 540, input devices 550, and output devices 560 are illustrated as communicatively coupled to each other via the bus 570, thereby providing connectivity between the above-described components. In alternative embodiments, the above-described components may be communicatively coupled in a different manner than illustrated in FIG. 5. For example, one or more of the above-described components may be directly coupled to other components, or may be coupled to each other, via one or more intermediary components (not shown). In some embodiments, the bus 570 may be omitted and the components are coupled directly to each other using suitable wired or wireless connections.

FIG. 6 provides a high-level logic flow diagram of an illustrative MTJ free magnetic stack manufacturing method 600 in which the free magnetic stack 110 includes a protective layer 106 disposed between a cap layer 104 and a cap metal layer 118A, in accordance with at least one embodiment described herein. Disposing the protective layer 106 between the cap layer 104 and the cap metal layer 118A beneficially improves the interface anisotropy of the free magnetic layer 110 thereby increasing the stability of the pSTTM device. The method 600 commences at 602.

At 604, a cap layer 104 that includes magnesium oxide (MgO) is formed, patterned, or otherwise deposited on, about, or across at least a portion of an uppermost layer of a free magnetic stack 110. In some implementations, the cap layer 104 may be patterned, or otherwise deposited on, about, or across at least a portion of an uppermost magnetic layer 112 of a free magnetic stack 110.

The cap layer 104 may be deposited, patterned, or otherwise formed using any currently available and/or future developed patterning or deposition technique. Such techniques may include, but are not limited to, physical vapor deposition (PVD), photolithography, electroplating, electro-less plating, sputtering, or similar. In some implementations, the cap layer 104 may have a thickness of less than 1 nanometer (nm).

At 606, a protective layer 106 is formed, patterned, or otherwise deposited on, about, or across at least a portion of the cap layer 104. The protective layer 106 may be deposited, patterned, or otherwise formed using any currently available or future developed deposition technology and/or techniques, such as physical vapor deposition (PVD), photolithography, electroplating, electro-less plating, sputtering, or similar. The protective layer 106 may include one or more materials, elements, or compounds capable of protecting the cap layer 104 from physical and/or chemical attack and/or damage caused by the cap metal layer 118A deposited on or across all or a portion of the protective layer 106. The protective layer 106 includes one or more of the following elements or one or more compounds containing one of the following elements: ruthenium (Ru); cobalt (Co); iron (Fe); boron (B); molybdenum (Mo); and platinum (Pt). In at least one implementation, the protective layer 106 may include one or more magnetic alloys such as CoFeB, such as $Co_{20}Fe_{60}B_{20}$. In some implementations, the protective layer 106 may have a thickness of about: 2 nanometers (nm) or less; about 1.5 nm or less; about 1 nm or less; or about 0.5 nm or less.

At 608, a cap metal layer 118A is formed, patterned, or otherwise deposited on, about, or across all or a portion of the protective layer 106 in the free magnetic stack 110. In embodiments, a top electrode 118 may include all or a portion of the cap metal layer 118A. The cap metal layer 118A may be deposited, patterned, or otherwise formed using any currently available or future developed deposition technology and/or techniques, such as physical vapor deposition (PVD), photolithography, electroplating, electro-less plating, sputtering, or similar. In some implementations, the cap metal layer 118A may have a thickness of about: 7 nanometers (nm) or less; about 5 nm or less; about 4 nm or less; or about 2.5 nm or less. The method 600 concludes at 610.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a magnetic tunnel junction (MTJ) free magnetic stack. The MTJ free magnetic stack may include a cap layer; a plurality of magnetic layers having a first magnetic layer disposed proximate the cap layer; a cap metal layer; and a protective insert layer disposed between the cap layer and the cap metal layer, and proximate both the cap layer and the cap metal layer.

Example 2 may include elements of example 1 and may additionally include at least one non-magnetic insert layer disposed between at least two of the plurality of magnetic layers.

Example 3 may include elements of example 1 where the protective insert layer comprises at least one of: ruthenium (Ru); cobalt/iron/boron (CoFeB); molybdenum (Mo); cobalt (Co); tungsten (W); and platinum (Pt).

Example 4 may include elements of example 1 where the protective insert layer comprises a layer having a thickness of from about 0.5 nanometers (nm) to about 1 nm.

Example 5 may include elements of example 1 where the cap metal layer comprises a tantalum cap metal layer having a thickness of about 0.5 nanometers (nm) or less.

Example 6 may include elements of any of examples 1 through 5 and may additionally include a dielectric layer disposed proximate a second magnetic layer included in the plurality of magnetic layers.

Example 7 may include elements of example 6 where each of the plurality of magnetic layers is disposed between the cap layer and the dielectric layer.

Example 8 may include elements of example 7 where the dielectric layer comprises a magnesium oxide MgO dielectric layer having a thickness of about 1 nanometer (nm) or greater.

Example 9 may include elements of example 8 where the cap layer comprises an cap magnesium oxide (MgO) layer having a thickness of about 1 nanometer (nm) or less.

According to example 10, there is provided a magnetic tunnel junction (MTJ) free magnetic stack manufacturing method. The method may include depositing a cap layer across at least a portion of a first magnetic layer included in a plurality of magnetic layers; depositing a protective insert layer across at least a portion of the cap layer; and depositing a cap metal layer across at least a portion of the protective layer.

Example 11 may include elements of example 10 and may additionally include depositing a dielectric filter layer across at least a portion of a second magnetic layer included in the plurality of magnetic layers, the first magnetic layer proximate a first end of the MTJ free magnetic stack, the second magnetic layer proximate a second end of the MTJ free magnetic stack opposite the first end.

Example 12 may include elements of example 11 where the dielectric layer comprises a magnesium oxide (MgO) layer having a thickness of about 1 nanometer (nm) or greater.

Example 13 may include elements of example 11 and the method may additionally include interleaving at least one non-magnetic insert layer with the plurality of magnetic layers.

Example 14 may include elements of example 13 where interleaving at least one non-magnetic insert layer with the plurality of magnetic layers may include interleaving a plurality of non-magnetic insert layers with the plurality of magnetic layers.

Example 15 may include elements of example 10 where depositing a protective insert layer across at least a portion of the cap layer may include: depositing a protective insert layer including at least one of: ruthenium (Ru); cobalt/iron/boron (CoFeB); molybdenum (Mo); cobalt (Co); tungsten (W); and platinum (Pt) across at least a portion of the cap layer.

Example 16 may include elements of example 15 where depositing a protective insert layer including at least one of: ruthenium (Ru); cobalt/iron/boron (CoFeB); molybdenum (Mo); cobalt (Co); tungsten (W); and platinum (Pt) across at least a portion of the cap layer may include: depositing a protective insert layer having a thickness of from about 0.5 nanometers (nm) to about 1 nm and including at least one of: ruthenium (Ru); cobalt/iron/boron (CoFeB); molybdenum (Mo); cobalt (Co); tungsten (W); and platinum (Pt) across at least a portion of the cap layer.

Example 17 may include elements of example 10 where depositing a cap metal layer across at least a portion of the protective layer may include: depositing a cap tantalum (Ta) layer having a thickness of about 0.5 nanometers (nm) or less across at least a portion of the protective layer.

Example 18 may include elements of examples 10 through 17 where depositing a cap layer across at least a portion of a first magnetic layer may include depositing a cap layer having a thickness of about 1 nanometer (nm) or less across at least a portion of a first magnetic layer.

According to example 19, there is provided a perpendicular spin transfer torque memory (pSTTM) device that includes a magnetic tunnel junction (MTJ) storage device, the pSTTM device may include a solid-state switching device, that includes: a source coupled to a source line; a gate coupled to a word line; and a drain; wherein the MTJ storage device includes: a first electrode coupled to the solid-state switching device drain; a second electrode coupled to a bit line; a fixed magnetic layer stack coupled to the first electrode; a dielectric layer coupled to the fixed magnetic layer stack, opposite the first electrode; and a free magnetic stack coupled to the second electrode, the free magnetic stack including: an cap layer; a plurality of magnetic layers having a first magnetic layer disposed proximate the cap layer; a cap metal layer; and a protective insert layer disposed between the cap layer and the cap metal layer, and proximate both the cap layer and the cap metal layer.

Example 20 may include elements of example 19 where the MTJ free magnetic stack may further include at least one non-magnetic insert layer disposed between at least two of the plurality of magnetic layers.

Example 21 may include elements of example 19 where the MTJ protective insert layer may include at least one of: ruthenium (Ru); cobalt/iron/boron (CoFeB); molybdenum (Mo); cobalt (Co); tungsten (W); and platinum (Pt).

Example 22 may include elements of example 21 where the MTJ protective insert layer may include a layer having a thickness of from about 0.5 nanometers (nm) to about 1 nm.

Example 23 may include elements of example 19 where the MTJ cap metal layer may include a cap tantalum (Ta) layer having a thickness of about 0.5 nanometers (nm) or less.

Example 24 may include elements of any of examples 19 through 23 where the MTJ may further include a dielectric layer disposed proximate a second magnetic layer included in the plurality of magnetic layers.

Example 25 may include elements of example 24 where each of the plurality of magnetic layers may be disposed between the cap layer and the dielectric layer.

Example 26 may include elements of example 25 where the MTJ dielectric layer may include a magnesium oxide (MgO) dielectric layer having a thickness of about 1 nanometer (nm) or greater.

Example 27 may include elements of example 26 where the MTJ cap layer may include an cap magnesium oxide (MgO) layer having a thickness of about 1 nanometer (nm) or less.

According to example 28, there is included a perpendicular spin transfer torque memory (pSTTM) data storage method. The method may include selectively passing a write current through a magnetic tunnel junction (MTJ) device that includes an MTJ free magnetic stack to store digital data by altering the magnetic spin orientation of the MTJ free magnetic stack between an upward direction and a downward direction, the MTJ free magnetic stack including: a cap layer; a plurality of magnetic layers having a first magnetic layer disposed proximate the cap layer; a cap metal layer; and a protective insert layer disposed between the cap layer and the cap metal layer, and proximate both the cap layer and the cap metal layer.

Example 29 may include elements of example 28 and the method may additionally include passing a read current through the MTJ device to selectively measure an electrical resistance of the MTJ device.

Example 30 may include elements of any of examples 28 or 29 where selectively passing a write current through a magnetic tunnel junction (MTJ) device that includes an MTJ free magnetic stack may include adjusting a voltage applied to at least one of: a source line conductively coupled to a fixed magnetic layer of the MTJ device or a bit line conductively coupled to the MTJ free magnetic stack.

According to example 31, there is provided a magnetic tunnel junction (MTJ) free magnetic stack manufacturing system. The manufacturing system may include a means for depositing a cap layer across at least a portion of a first magnetic layer included in a plurality of magnetic layers; a means for depositing a protective insert layer across at least a portion of the cap layer; and a means for depositing a cap metal layer across at least a portion of the protective layer.

Example 32 may include elements of example 31, and the manufacturing system may further include a means for depositing a dielectric layer across at least a portion of a second magnetic layer included in the plurality of magnetic layers, the first magnetic layer proximate a first end of the MTJ free magnetic stack, the second magnetic layer proximate a second end of the MTJ free magnetic stack, the second end opposite the first end.

Example 33 may include elements of example 32 where the means for depositing an dielectric layer across at least a portion of a second magnetic layer may include a means for depositing a dielectric layer having a thickness of about 1 nanometer (nm) or greater across at least a portion of a second magnetic layer.

Example 34 may include elements of example 32 and the manufacturing system may further include a means for interleaving at least one non-magnetic insert layer with the plurality of magnetic layers.

Example 35 may include elements of example 34 where the means for interleaving at least one non-magnetic insert layer with the plurality of magnetic layers may include a means for interleaving a plurality of non-magnetic insert layers with the plurality of magnetic layers.

Example 36 may include elements of example 31 where the means for depositing a protective insert layer across at least a portion of the cap layer may include a means for depositing a protective insert layer including at least one of: ruthenium (Ru); cobalt/iron/boron (CoFeB); molybdenum (Mo); cobalt (Co); tungsten (W); and platinum (Pt) across at least a portion of the cap layer.

Example 37 may include elements of example 36 where the means for depositing a protective insert layer including at least one of: ruthenium (Ru); cobalt/iron/boron (CoFeB); molybdenum (Mo); cobalt (Co); tungsten (W); and platinum (Pt) across at least a portion of the cap layer may include a means for depositing a protective insert layer including at least one of: ruthenium (Ru); cobalt/iron/boron (CoFeB); molybdenum (Mo); cobalt (Co); tungsten (W); and platinum (Pt) and having a thickness of from about 0.5 nanometers (nm) to about 1 nm across at least a portion of the cap layer.

Example 38 may include elements of example 31 where the means for depositing a cap metal layer across at least a portion of the protective layer may include a means for depositing a cap tantalum (Ta) layer having a thickness of about 0.5 nanometers (nm) or less across at least a portion of the protective layer.

Example 39 may include elements of any of examples 31 through 38 where the means for depositing a cap layer across at least a portion of a first magnetic layer may include a means for depositing a cap magnesium oxide (MgO) layer having a thickness of about 1 nanometer (nm) or less across at least a portion of a first magnetic layer.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A magnetic tunnel junction (MTJ) free magnetic stack, comprising:
    a cap layer, the cap layer comprising a metal oxide material selected from the group consisting of aluminum oxide (AlOx), tantalum oxide (TaOx), gadolinium oxide (GdOx), hafnium oxide (HfOx), titanium oxide (TiOx) and tungsten oxide (WOx);
    a plurality of magnetic layers having a first magnetic layer disposed proximate the cap layer;
    a cap metal layer; and
    a protective insert layer disposed between the cap layer and the cap metal layer, and proximate both the cap layer and the cap metal layer.

2. The MTJ free magnetic stack of claim 1, further comprising:
    at least one non-magnetic insert layer disposed between at least two of the plurality of magnetic layers.

3. The MTJ free magnetic stack of claim 1 wherein the protective insert layer comprises at least one of: ruthenium (Ru); cobalt/iron/boron (CoFeB); molybdenum (Mo); cobalt (Co); tungsten (W); and platinum (Pt).

4. The MTJ free magnetic stack of claim 1 wherein the protective insert layer comprises a layer having a thickness of from about 0.5 nanometers (nm) to about 1 nm.

5. The MTJ free magnetic stack of claim 1 wherein the cap metal layer comprises a layer having a thickness of about 0.5 nanometers (nm) or less.

6. The MTJ free magnetic stack of claim 1, further comprising:
    a dielectric layer disposed proximate a second magnetic layer included in the plurality of magnetic layers.

7. The MTJ free magnetic stack of claim 6 wherein each of the plurality of magnetic layers is disposed between the cap layer and the dielectric layer.

8. The MTJ free magnetic stack of claim 7 wherein the dielectric layer comprises a magnesium oxide (MgO) layer having a thickness of about 1 nanometer (nm) or greater.

9. The MTJ free magnetic stack of claim 8 wherein the cap layer comprises a magnesium oxide (MgO) layer having a thickness of about 1 nanometer (nm) or less.

10. A magnetic tunnel junction (MTJ) free magnetic stack manufacturing method, comprising:
   depositing a cap layer across at least a portion of a first magnetic layer included in a plurality of magnetic layers, the cap layer comprising a metal oxide material selected from the group consisting of aluminum oxide (AlOx), tantalum oxide (TaOx), gadolinium oxide (GdOx), hafnium oxide (HfOx), titanium oxide (TiOx) and tungsten oxide (WOx);
   depositing a protective insert layer across at least a portion of the cap layer; and
   depositing a cap metal layer across at least a portion of the protective layer.

11. The MTJ free magnetic stack manufacturing method of claim 10, further comprising:
   depositing a dielectric layer across at least a portion of a second magnetic layer included in the plurality of magnetic layers, the first magnetic layer proximate a first end of the MTJ free magnetic stack, the second magnetic layer proximate a second end of the MTJ free magnetic stack opposite the first end.

12. The MTJ free magnetic stack manufacturing method of claim 11 wherein depositing a dielectric layer across at least a portion of a second magnetic layer comprises:
   depositing a magnesium oxide (MgO) dielectric layer having a thickness of about 1 nanometer (nm) or greater across at least a portion of a second magnetic layer.

13. The MTJ free magnetic stack manufacturing method of claim 11 further comprising:
   interleaving at least one non-magnetic insert layer with the plurality of magnetic layers.

14. The MTJ free magnetic stack manufacturing method of claim 13 wherein interleaving at least one non-magnetic insert layer with the plurality of magnetic layers comprises:
   interleaving a plurality of non-magnetic insert layers with the plurality of magnetic layers.

15. The MTJ free magnetic stack manufacturing method of claim 10 wherein depositing a protective insert layer across at least a portion of the cap layer comprises:
   depositing a protective insert layer including at least one of: ruthenium (Ru); cobalt/iron/boron (CoFeB); molybdenum (Mo); cobalt (Co); tungsten (W); and platinum (Pt) across at least a portion of the cap layer.

16. The MTJ free magnetic stack manufacturing method of claim 15 wherein depositing a protective insert layer including at least one of: ruthenium (Ru); cobalt/iron/boron (CoFeB); molybdenum (Mo); cobalt (Co); tungsten (W); and platinum (Pt) across at least a portion of the cap layer comprises:
   depositing a protective insert layer including at least one of: ruthenium (Ru); cobalt/iron/boron (CoFeB); molybdenum (Mo); cobalt (Co); tungsten (W); and platinum (Pt) and having a thickness of from about 0.5 nanometers (nm) to about 1 nm across at least a portion of the cap layer.

17. The MTJ free magnetic stack manufacturing method of claim 10 wherein depositing a cap metal layer across at least a portion of the protective layer comprises:
   depositing a tantalum (Ta) cap metal layer having a thickness of about 0.5 nanometers (nm) or less across at least a portion of the protective layer.

18. The MTJ free magnetic stack manufacturing method of claim 10 wherein depositing a cap layer across at least a portion of a first magnetic layer comprises:
   depositing a cap layer having a thickness of about 1 nanometer (nm) or less across at least a portion of a first magnetic layer.

19. A perpendicular spin transfer torque memory (pSTTM) device that includes a magnetic tunnel junction (MTJ) storage device, the pSTTM device comprising:
   a solid-state switching device, that includes:
      a source coupled to a source line;
      a gate coupled to a word line; and
      a drain;
   wherein the MTJ storage device includes:
      a first electrode coupled to the solid-state switching device drain;
      a second electrode coupled to a bit line;
      a fixed magnetic layer stack coupled to the first electrode
      a dielectric layer coupled to the fixed magnetic layer stack, opposite the first electrode; and
      a free magnetic stack coupled to the second electrode, the free magnetic stack including:
         a cap layer, the cap layer comprising a metal oxide material selected from the group consisting of aluminum oxide (AlOx), tantalum oxide (TaOx), gadolinium oxide (GdOx), hafnium oxide (HfOx), titanium oxide (TiOx) and tungsten oxide (WOx);
         a plurality of magnetic layers having a first magnetic layer disposed proximate the cap layer;
         a cap metal layer; and
         a protective insert layer disposed between the cap layer and the cap metal layer, and proximate both the cap layer and the cap metal layer.

20. The pSTTM device of claim 19 wherein the MTJ free magnetic stack further comprises at least one non-magnetic insert layer disposed between at least two of the plurality of magnetic layers.

21. The pSTTM device of claim 19 wherein the MTJ protective insert layer comprises at least one of: ruthenium (Ru); cobalt/iron/boron (CoFeB); molybdenum (Mo); cobalt (Co); tungsten (W); and platinum (Pt).

22. The pSTTM device of claim 21 wherein the MTJ protective insert layer comprises a layer having a thickness of from about 0.5 nanometers (nm) to about 1 nm.

23. A magnetic tunnel junction (MTJ) free magnetic stack manufacturing system, comprising:
   a means for depositing a cap layer across at least a portion of a first magnetic layer included in a plurality of magnetic layers, the cap layer comprising a metal oxide material selected from the group consisting of aluminum oxide (AlOx), tantalum oxide (TaOx), gadolinium oxide (GdOx), hafnium oxide (HfOx), titanium oxide (TiOx) and tungsten oxide (WOx);
   a means for depositing a protective insert layer across at least a portion of the cap layer; and
   a means for depositing a cap metal layer across at least a portion of the protective layer.

24. The MTJ free magnetic stack manufacturing system of claim 23, further comprising:

a means for depositing a dielectric layer across at least a portion of a second magnetic layer included in the plurality of magnetic layers, the first magnetic layer proximate a first end of the MTJ free magnetic stack, the second magnetic layer proximate a second end of the MTJ free magnetic stack opposite the first end.

25. The MTJ free magnetic stack manufacturing system of claim 24 wherein the means for depositing a dielectric layer across at least a portion of a second magnetic layer comprises:
a means for depositing a layer having a thickness of about 1 nanometer (nm) or greater across at least a portion of a second magnetic layer.

26. The MTJ free magnetic stack manufacturing system of claim 24 further comprising:
a means for interleaving at least one non-magnetic insert layer with the plurality of magnetic layers.

* * * * *